(12) United States Patent
Kappert et al.

(10) Patent No.: US 12,209,913 B2
(45) Date of Patent: Jan. 28, 2025

(54) PIEZOELECTRIC DEVICE HAVING A SUPPORT WITH A NEUTRAL FIBER

(71) Applicant: TDK Electronics AG, Munich (DE)

(72) Inventors: Sandro Kappert, Graz (AT); Stefan Sax, Graz (AT); Dominik Taferner, Preding (AT); Amira Hedhili, Graz (AT)

(73) Assignee: TDK Electronics AG, Munich (DE)

( * ) Notice: Subject to any disclaimer, the term of this patent is extended or adjusted under 35 U.S.C. 154(b) by 681 days.

(21) Appl. No.: 17/610,406

(22) PCT Filed: May 15, 2020

(86) PCT No.: PCT/EP2020/063735
§ 371 (c)(1),
(2) Date: Nov. 10, 2021

(87) PCT Pub. No.: WO2020/229696
PCT Pub. Date: Nov. 19, 2020

(65) Prior Publication Data
US 2022/0238784 A1 Jul. 28, 2022

(30) Foreign Application Priority Data
May 15, 2019 (DE) .......................... 102019112771.8

(51) Int. Cl.
*G01J 5/34* (2022.01)
*G01L 1/16* (2006.01)
(Continued)

(52) U.S. Cl.
CPC .................. *G01J 5/34* (2013.01); *G01L 1/16* (2013.01); *G01R 27/2605* (2013.01);
(Continued)

(58) Field of Classification Search
CPC ...... H10N 30/03; H10N 30/101; H10N 30/50; H10N 30/852; H10N 30/857; H10N 30/88;
(Continued)

(56) References Cited

U.S. PATENT DOCUMENTS 3,750,127 A    7/1973  Ayers et al.
3,760,203 A    9/1973  Guntersdorfer
(Continued)

FOREIGN PATENT DOCUMENTS

CN    102983851 A    3/2013
CN    103562014 A    2/2014
(Continued)

*Primary Examiner* — Emily P Pham
(74) *Attorney, Agent, or Firm* — Slater Matsil, LLP (57) ABSTRACT

In an embodiment a device includes a piezoelectric transducer element and a support connected mechanically to each other thereby forming an assembly, wherein the piezoelectric transducer element and the support are configured to be jointly deformed under an action of a first force, wherein the support includes a neutral fiber arranged inside the support, the neutral fiber configured to not undergo any change in length during a bending of the assembly, and wherein the piezoelectric transducer element includes a ferroelectric polymer layer or a layer having a composite material including a ceramic material and a piezoelectric polymer matrix.

16 Claims, 6 Drawing Sheets

(51) Int. Cl.
  *G01R 27/26* (2006.01)
  *H10N 30/00* (2023.01)
  *H10N 30/03* (2023.01)
  *H10N 30/50* (2023.01)
  *H10N 30/85* (2023.01)
  *H10N 30/857* (2023.01)
  *H10N 30/88* (2023.01)
  *B25J 19/02* (2006.01)

(52) U.S. Cl.
  CPC ........... *H10N 30/03* (2023.02); *H10N 30/101* (2024.05); *H10N 30/50* (2023.02); *H10N 30/852* (2023.02); *H10N 30/857* (2023.02); *H10N 30/88* (2023.02); *B25J 19/028* (2013.01)

(58) Field of Classification Search
  CPC ............. H10N 30/2042; H10N 30/302; H10N 30/506; H10N 30/87; H10N 30/878; H10N 15/10; H03K 17/955; H03K 17/964; H03K 17/962; E05Y 2400/852; E05Y 2400/858; E05Y 2900/104; E05D 15/02; E05D 15/73; G01J 5/34; G01J 5/0025; G01J 5/046; G01J 5/00; G01J 5/12; G01L 1/16; G01R 27/2605; G01D 5/24; G01D 5/12; B25J 19/028
  See application file for complete search history.

(56) References Cited

U.S. PATENT DOCUMENTS

| | | |
|---|---|---|
| 4,954,811 A | 9/1990 | Chatigny et al. |
| 5,471,545 A | 11/1995 | Negami et al. |
| 5,702,629 A | 12/1997 | Cui et al. |
| 6,423,412 B1 | 7/2002 | Zhang et al. |
| 6,434,917 B1 | 8/2002 | Bartel |
| 6,605,246 B2 | 8/2003 | Zhang et al. |
| 7,024,738 B2 | 4/2006 | Fujii et al. |
| 8,877,085 B2 | 11/2014 | Capsal et al. |
| 9,050,940 B2 | 6/2015 | Geiss |
| 9,337,803 B2 | 5/2016 | Takahashi et al. |
| 9,542,028 B2 | 1/2017 | Filiz et al. |
| 9,965,930 B1 | 5/2018 | Christensen et al. |
| 10,391,769 B2 | 8/2019 | Asaoka et al. |
| 10,963,057 B2 | 3/2021 | Choi |
| 11,262,246 B2 | 3/2022 | Le Rhun et al. |
| 2002/0011589 A1 | 1/2002 | Lopatin et al. |
| 2004/0019810 A1 | 1/2004 | Casebolt et al. |
| 2005/0109587 A1 | 5/2005 | Best et al. |
| 2005/0140249 A1 | 6/2005 | Kita et al. |
| 2005/0156486 A1 | 7/2005 | Orten |
| 2005/0219328 A1 | 10/2005 | Kodama |
| 2006/0196280 A1 | 9/2006 | Xi et al. |
| 2007/0089939 A1 | 4/2007 | Liebetrau |
| 2007/0106291 A1 | 5/2007 | Thao et al. |
| 2007/0185485 A1 | 8/2007 | Hauck et al. |
| 2007/0266799 A1 | 11/2007 | Sugiura |
| 2009/0007645 A1 | 1/2009 | Shih et al. |
| 2009/0309616 A1 | 12/2009 | Klinghult et al. |
| 2010/0181871 A1 | 7/2010 | Daniel et al. |
| 2013/0160109 A1 | 6/2013 | Klinghult |
| 2013/0200756 A1 | 8/2013 | Maki |
| 2013/0267946 A1 | 10/2013 | Brannan et al. |
| 2014/0354608 A1 | 12/2014 | Kitchens, II et al. |
| 2015/0068316 A1 | 3/2015 | Woerdenweber |
| 2015/0120051 A1 | 4/2015 | Matsuzawa et al. |
| 2015/0165479 A1 | 6/2015 | Lasiter et al. |
| 2016/0011063 A1 | 1/2016 | Zhang et al. |
| 2016/0072042 A1 | 3/2016 | Fukuda et al. |
| 2017/0139495 A1 | 5/2017 | Ozyilmaz et al. |
| 2017/0153105 A1 | 6/2017 | Chang et al. |
| 2017/0192560 A1 | 7/2017 | Ham et al. |
| 2017/0205374 A1* | 7/2017 | Koehler ................... B06B 1/06 |
| 2018/0108826 A1 | 4/2018 | Tajitsu et al. |
| 2018/0138886 A1 | 5/2018 | Yoon et al. |
| 2018/0308997 A1 | 10/2018 | Kotru et al. |
| 2018/0364113 A1 | 12/2018 | Suzuki et al. |
| 2019/0032272 A1 | 1/2019 | Liff et al. |
| 2019/0099756 A1 | 4/2019 | Pang et al. |
| 2020/0122196 A1 | 4/2020 | Kobrin |
| 2020/0177103 A1 | 6/2020 | Lindsay et al. |

FOREIGN PATENT DOCUMENTS

| | | |
|---|---|---|
| CN | 106662424 A | 5/2017 |
| DE | 2109063 A1 | 9/1972 |
| DE | 60000948 T2 | 7/2003 |
| DE | 102015200240 A1 | 7/2015 |
| DE | 102015114945 A1 | 3/2016 |
| DE | 112016006701 T5 | 12/2018 |
| EP | 1791192 A1 | 5/2007 |
| EP | 3633336 A1 | 4/2020 |
| GB | 2498433 | 7/2013 |
| JP | S61247930 A | 11/1986 |
| JP | S6382336 A | 4/1988 |
| JP | S63289460 A | 11/1988 |
| JP | H0295263 A | 4/1990 |
| JP | H04150079 A | 5/1992 |
| JP | H06139630 A | 5/1994 |
| JP | H0771952 A | 3/1995 |
| JP | 107175024 A | 7/1995 |
| JP | H088834 A | 1/1996 |
| JP | H08262039 A | 10/1996 |
| JP | H09113251 A | 5/1997 |
| JP | 2000065716 A | 3/2000 |
| JP | 2000507392 A | 6/2000 |
| JP | 2000230853 A | 8/2000 |
| JP | 2000230871 A | 8/2000 |
| JP | 2000346717 A | 12/2000 |
| JP | 2002513514 A | 5/2002 |
| JP | 2004304193 A | 10/2004 |
| JP | 2005041053 A | 2/2005 |
| JP | 2005060922 A | 3/2005 |
| JP | 2005114395 A | 4/2005 |
| JP | 2005522292 A | 7/2005 |
| JP | 2005347364 A | 12/2005 |
| JP | 2006144418 A | 6/2006 |
| JP | 2007119250 A | 5/2007 |
| JP | 2007285824 A | 11/2007 |
| JP | 2010506621 A | 3/2010 |
| JP | 2013513937 A | 4/2013 |
| JP | 2014238766 A | 12/2014 |
| JP | 2014240789 A | 12/2014 |
| JP | 2016076512 A | 5/2016 |
| JP | 2016090382 A | 5/2016 |
| JP | 2016516174 A | 6/2016 |
| JP | 2016520935 A | 7/2016 |
| JP | 2017146283 A | 8/2017 |
| JP | 2017198573 A | 11/2017 |
| JP | 2017215319 A | 12/2017 |
| JP | 2018173292 A | 11/2018 |
| JP | 2018182009 A | 11/2018 |
| JP | 2019006027 A | 1/2019 |
| JP | 2019007749 A | 1/2019 |
| KR | 100758029 B1 | 9/2007 |
| KR | 101519043 B1 | 5/2015 |
| WO | 9530135 A1 | 11/1995 |
| WO | 0184642 A1 | 11/2001 |
| WO | 2016175321 A1 | 11/2016 |
| WO | 2018151440 A1 | 8/2018 |
| WO | 2019022114 A1 | 1/2019 |
| WO | 2020112160 A1 | 6/2020 |

* cited by examiner

PIEZOELECTRIC DEVICE HAVING A SUPPORT WITH A NEUTRAL FIBER

This patent application is a national phase filing under section 371 of PCT/EP2020/063735, filed May 15, 2020, which claims the priority of German patent application 102019112771.8, filed May 15, 2019, each of which is incorporated herein by reference in its entirety.

TECHNICAL FIELD

The present invention relates to a device comprising a piezoelectric transducer element and a support.

BACKGROUND

The device can be, for example, a sensor for detecting mechanical deformations. Such sensors have played an important role in most diverse fields of application for a long time. In many control processes, a mechanical deformation, for example, by pressure or torsion, is detected and used as a control variable. With increasing use of autonomous systems, such detection of mechanical deformations will gain further in importance.

In general, a sensor system consists of a transducer element, which converts a measured quantity into a measurable electric signal, and an evaluation electronics system, which is used for signal processing and, for example, amplifies, filters, and/or digitizes the signal. An output signal, which is output by the evaluation electronics system, can subsequently be transferred to a superordinate regulating or control system.

In order to improve the signal quality, solutions are known in the prior art, in which an attempt is made to amplify a signal generated by the transducer element. For example, U.S. Pat. No. 6,434,917 B1 proposes a multilayer structure of piezoelectric components in order to produce a stronger signal in a transducer element. However, the piezoelectric transducer element having a multilayer structure results in an increased expenditure in process control during its manufacture compared to a piezoelectric transducer element having a single piezoelectric layer. U.S. Patent Application Publication No. 2010/181871 A1 proposes to specifically influence a signal intensity via a selection of the geometric and mechanical parameters of the piezoelectric transducer element. As a result, however, the design freedom with regard to the geometry and the mechanical configuration of the transducer element is restricted.

SUMMARY

Embodiments provide an improved device. A device is proposed, for example, which does not impose any special requirements with regard to the configuration of the transducer element and/or enables a simple manufacturing method.

A device is proposed comprising a piezoelectric transducer element and a support, which are connected mechanically to each other to form an assembly, in such a manner that the piezoelectric transducer element and the support are jointly deformed under the action of a force. The support is configured in such a manner that a neutral fiber, which does not undergo any change in length during bending of the assembly comprising the piezoelectric transducer element and the support, is arranged inside the support.

The properties of the device can be determined in this case by a suitable selection of the mechanical and geometric properties of the support. In particular, the support can be configured to allow a high electric response in the piezoelectric transducer element. Since the neutral fiber is located inside the support, the piezoelectric transducer element can be active over its entire volume. The neutral fiber is not formed inside the piezoelectric transducer element so that the entire volume of the piezoelectric transducer element undergoes a change in length and therefore contributes to producing an electric voltage.

The device can be operated as a sensor and/or as an actuator. When operated as a sensor, the device can be configured to determine the magnitude of the force acting on the device by means of an electric voltage generated in the piezoelectric transducer element.

When operated as an actuator, the force which deforms the piezoelectric transducer element and the support can be produced by the piezoelectric transducer element itself. In this case, the force is produced by applying a voltage to the piezoelectric transducer element. This can result in a deflection of the device. Since the neutral fiber is arranged in the support and not in the piezoelectric transducer element, the entire volume of the piezoelectric transducer element can contribute to the deflection.

The piezoelectric transducer element and the support can be referred to as an assembly if a deformation of the piezoelectric transducer element always results in a deformation of the support. The piezoelectric transducer element is fastened flat on the support. In particular, a bottom side of the piezoelectric transducer element can be fastened on a surface of the support, in which case even in the event of a bending of the device, the bottom side of the piezoelectric transducer element abuts against the top side of the support.

The piezoelectric transducer element can be disposed on the support. In particular, the piezoelectric transducer element can be printed on the support. For example, the piezoelectric transducer element can be applied to the support by means of screen printing. Alternatively, stencil printing, inkjet printing, doctor blading, vapor deposition or sputtering are also possible.

The device can, for example, be a beam clamped on one side or a beam clamped on two sides.

The piezoelectric transducer element can comprise a ceramic layer or a ferroelectric polymer layer or a layer comprising a composite material, comprising a ceramic material and a piezoelectric polymer matrix. Ceramic piezoelectric layers are characterized in that higher electric voltages are generated in them as a result of the piezoelectric effect compared to piezoelectric polymer layers. Ferroelectric polymer layers on the other hand enable the mechanical properties of plastics to be combined with the electrical properties of ceramic materials. Ferroelectric polymer layers are characterized in that they have a low modulus of elasticity and therefore a high mechanical flexibility. An example for a ferroelectric polymer layer is PVDF:TrFE. An example for a ceramic piezoelectric layer is PZT.

A thickness of the support can be configured in such a manner that the neutral fiber is arranged inside the support. The thickness of the support here specifies the extension of the support from a bottom side to a top side of the support. The piezoelectric layer can be arranged flat on the top side of the support. The thickness of the support is therefore one of the properties of the support that can be suitably selected to bring about a preferred position of the neutral fiber.

The thickness of the support can, for example, lie in a range between 1 µm and 500 µm. The thickness of the support should be selected taking into account the thickness of the piezoelectric transducer element. By means of a suitable thickness ratio, it can be ensured that the neutral fiber is formed inside the support. If a support having a thickness in the range between 1 µm and 500 µm is combined with a piezoelectric transducer element whose thickness lies in the range between 10 nm and 100 µm to form an assembly, the neutral fiber lies in the support.

If a transducer element whose thickness lies between 10 nm and 100 µm is combined on a support having a thickness in the range of 1 µm to 500 µm, an improvement in the output signal of the transducer element can be observed since the position of the neutral fiber is located far away from the transducer element and thus large mechanical stresses in terms of magnitude act on the transducer element.

The modulus of elasticity of the support can be configured in such a manner that the neutral fiber is arranged inside the support. A stiff support brings about a displacement of the neutral fiber away from the piezoelectric transducer element compared with a flexible support. If a variation in the thickness of the support is not possible, for example due to the application, it can be ensured by means of a suitable selection of the modulus of elasticity of the support that the neutral fiber is formed inside the support.

The modulus of elasticity of the support thus forms a further property which allows the position of the neutral fiber to be varied. By this means, a displacement of the neutral fiber to a desired position can be achieved without needing to vary the piezoelectric transducer element.

The device can comprise a sensor, which is configured to detect a deformation, which is produced by the force acting on the device. In this way, the force can be measured. The device can be configured in such a manner that the force produces an electric voltage and/or a charge in the piezoelectric transducer element, wherein the device is connected to an evaluation electronics system, which is configured to measure a magnitude of the electric voltage and/or the charge. The device can be used, for example, as a pressure sensor, distance sensor, or proximity sensor. By means of a suitable choice of the properties of the support, a particularly strong output signal can be produced in the transducer element here.

Alternatively or additionally, the device can comprise an actuator. The device can be configured in such a manner that the force is produced whereby an electric voltage is applied to the piezoelectric transducer element and the piezoelectric transducer element is deformed as a consequence of the applied electric voltage. By means of a suitable choice of the properties of the support, a particularly strong deformation of the piezoelectric transducer element can be brought about here. If the neutral fiber is not disposed inside the piezoelectric transducer element, each volume unit of the piezoelectric transducer element can contribute to the deformation.

The piezoelectric transducer element can have a multilayer structure with a plurality of piezoelectric layers and interposed inner electrodes. Alternatively, the piezoelectric transducer element can comprise a single piezoelectric layer. A multilayer structure offers the advantage that a higher electric voltage is generated in the piezoelectric transducer element here or that a stronger mechanical deformation occurs during operation as an actuator. A single-layer structure on the other hand offers the advantage that a manufacturing process is less complex.

The piezoelectric transducer element can comprise a single piezoelectric layer, an upper electrode, and a lower electrode, wherein the piezoelectric layer is disposed between the upper electrode and the lower electrode. Alternatively, the piezoelectric transducer element can comprise only a single piezoelectric layer and an upper electrode, wherein the piezoelectric layer is disposed between the upper electrode and the support, and the support comprises a conductive material and is configured to be used as an electrode.

The support can comprise a plastic, for example, polyimide, PET or PEN. Alternatively, the support can comprise a metal. For example, the support can comprise steel or aluminum.

A further aspect relates to an arrangement comprising an evaluation electronics system and the device described above. The evaluation electronics system is configured to measure an electric signal generated by the device. The evaluation electronics system can be configured to detect by means of a measured change in the electric signal whether an object is approaching the device or whether an object is touching the device. Changes to the evaluation electronics system for improving the signal quality can be reduced in scope and complexity, which subsequently can also be a cost advantage since it is ensured by modification of the support that the transducer element can provide a strong signal. A simple evaluation electronics system can thus be used.

BRIEF DESCRIPTION OF THE DRAWINGS

The present invention is described further hereinafter with reference to the figures.

DETAILED DESCRIPTION OF ILLUSTRATIVE EMBODIMENTS

Figure 1:
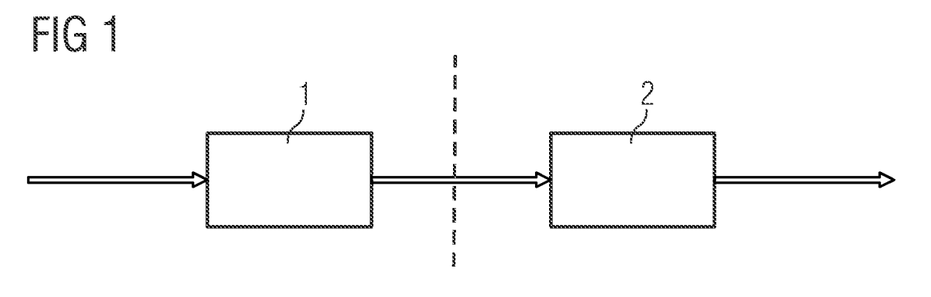
FIG. 1 shows an arrangement comprising a device and an electronics system.

FIG. 1 shows an arrangement comprising a device 1 and an electronics system 2. The arrangement shown in FIG. 1 can be operated as a sensor system and/or as an actuator system.

For operation as a sensor system, the device 1 is configured to convert a physical input signal into an electric output signal. The physical input signal is, for example, a force which acts on the device 1. The device 1 comprises, inter alia, a piezoelectric transducer element 3. The piezoelectric transducer element 3 converts, based on the piezoelectric effect, the physical input signal into an electric output signal which is transferred from the device 1 to the electronics system 2.

The electronics system 2 is configured to further process the electric output signal of the device 1. For example, the electronics system 2 can be configured to evaluate the electric output signal generated by the device 1 and convert it into a digital signal.

For operation as an actuator system, an electric input signal is transferred from the electronics 2 to the device 1.

The piezoelectric transducer element 3 converts the electric input signal into a mechanical deformation, which fulfills the actuator function.

In the arrangement described here, the requirements on a signal processing in the electronics system 2 can be kept low since the device 1 is configured to provide a strong response signal as electric output signal in sensor operation and to produce a strong mechanical deformation of the piezoelectric transducer element 3 as an actuator signal in actuator operation. The strong response signal or the strong actuator signal are in particular achieved by a suitable choice of the properties of a support 4 of the device 1.

Figure 2:
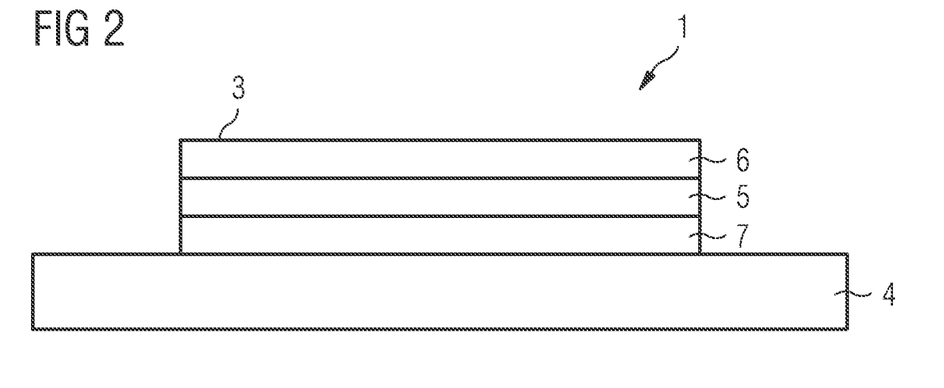
FIG. 2 shows a device according to a first exemplary embodiment.

FIG. 2 shows a first exemplary embodiment of the device 1. The device 1 comprises the piezoelectric transducer element 3 and the support 4. The piezoelectric transducer element 3 is disposed directly on the support 4. A bottom side of the piezoelectric transducer element 3 lies on a top side of the support 4. The piezoelectric transducer element 3 and the support 4 are mechanically connected to one another. In particular, the piezoelectric transducer element 3 and the support 4 form an assembly and can only be deformed jointly, e.g. bent.

The piezoelectric transducer element 3 comprises a piezoelectric layer 5, an upper electrode 6 and a lower electrode 7, wherein the piezoelectric layer 5 is disposed between the lower electrode 6 and the upper electrode 7. During actuator operation a voltage is applied between the two electrodes 6, 7, which brings about a mechanical deformation of the piezoelectric layer 5. In sensor operation the piezoelectric layer 5 can be deformed by a force acting on the device 1 from outside and consequently generates an electric voltage which is tapped at the electrodes 6, 7.

The piezoelectric layer 5 can comprise a ferroelectric polymer or consist of a ferroelectric polymer. Ferroelectric polymers have the mechanical properties of a plastic and combine these with the electrical properties of ceramic materials. A layer of a ferroelectric polymer can be produced by screen printing, stencil printing or inkjet printing. Alternatively, a layer of a ferroelectric polymer can be produced by vapor deposition or sputtering or by means of doctor blading. The said methods each require a support 4 on which the piezoelectric transducer element is applied.

Alternatively, the piezoelectric layer 5 can also comprise a piezoelectric ceramic material or consist of a piezoelectric ceramic material. Alternatively, the piezoelectric layer 5 can also comprise a composite material, comprising a polymer matrix and a piezoelectric ceramic material, or consist of such a composite material.

The support 4 can consist of a plastic, for example, polyimide, PET, or PEN.

The support 4 substantially co-determines the mechanical and electrical properties of the assembly comprising piezoelectric transducer element 3 and support 4. The mechanical and electrical properties of the assembly are determined by means of a suitable choice of the structural properties of the support 4, for example, such as its thickness, its modulus of elasticity, and the material. This relationship is explained in detail with reference to FIG. 3, which shows a device 1 on which the external force F is acting.

Figure 3:
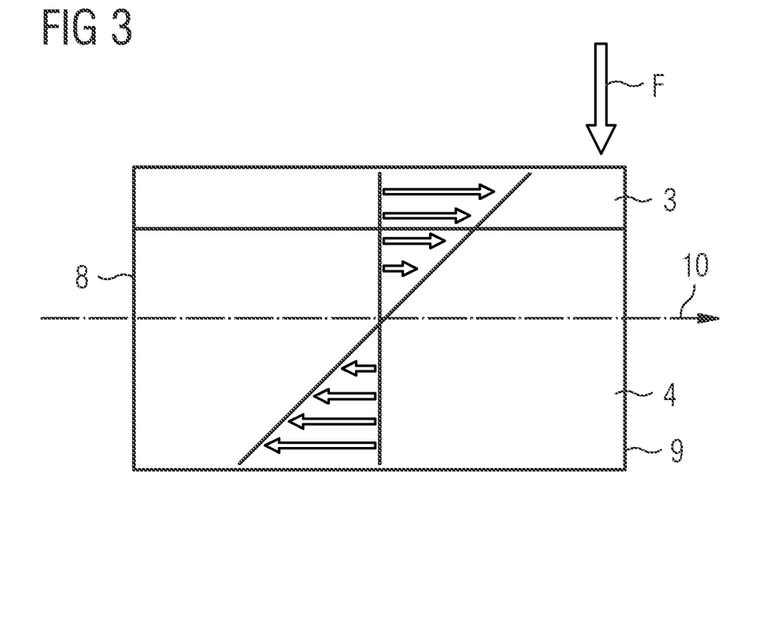
FIG. 3 shows a device which is clamped at a first end as well as the mechanical deformations produced in the device.

The device 1 shown in FIG. 3 is clamped at a first end 8. The force F acts on a second end 9 of the device 1 opposite the first end 8. The device 1 thus comprises a beam clamped on one side. However, the device 1 is by no means restricted to such configurations. Alternatively, the device 1 could be clamped, for example, at the first and second end 8, 9 and a central region of the device 1, which is disposed between the first and the second end, could be bent as a result of a force acting on the device 1.

The piezoelectric transducer element 3 and the support 4 bend as a result of the force acting on the device 1, wherein the piezoelectric transducer element 3 and the support 4 are moved at the second end 9 and remain unmoved at the first end 8. The piezoelectric transducer element 3, which is disposed on a top side of the device 1, is stretched by the bending, i.e. the length from the first end 8 to the second end 9 is increased. A bottom side of the support 4, which points away from the piezoelectric transducer element 3, is compressed by the bending, i.e. the length from the first end 8 to the second end 9 is reduced.

The mechanical stress, which is produced locally at various positions inside the device 1, is indicated by arrows in FIG. 3. FIG. 3 shows that particularly high mechanical stresses are formed close to the top side and close to the bottom side of the device and that the mechanical stresses produced decrease toward a neutral fiber 10, which is arranged centrally in the device 1. The neutral fiber 10 designates the plane of the device 1, which undergoes no change in length as a result of the acting stress. The precise position of the neutral fiber 10 is not necessarily in the geometric center of the piezoelectric transducer element 3 but is influenced by the moduli of elasticity and the geometric designs of the piezoelectric transducer element 3 and the support 4.

In the exemplary embodiment shown in FIG. 3 the neutral fiber 10 is disposed in the support 4 and far away from the piezoelectric transducer element 3. The piezoelectric transducer element 3 undergoes a change in length over its entire volume and an electric voltage is generated in the entire volume.

Figure 4:
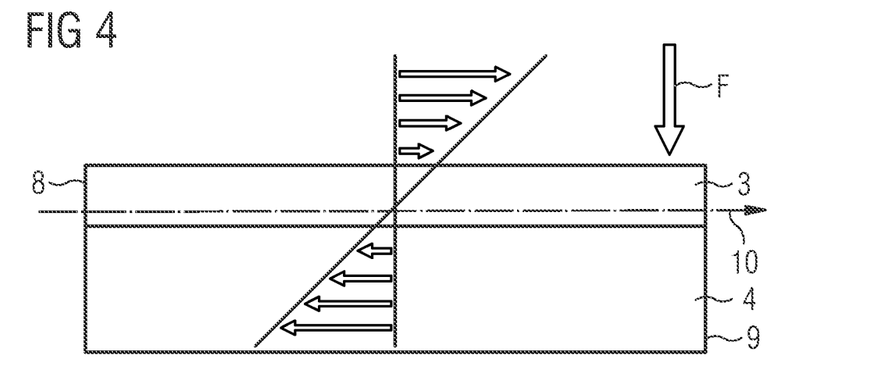
FIG. 4 shows a comparative device.

FIG. 4 shows a comparative device, in which the support is thinner compared with the device shown in FIG. 3. As a result of the thinner support, the neutral fiber is shifted into the piezoelectric transducer element. As a result of the force acting on the device in the comparative device shown in FIG. 4, the piezoelectric transducer element experiences a significantly smaller mechanical stress than in the exemplary embodiment shown in FIG. 3. Accordingly, in the exemplary embodiment shown in FIG. 4, only a lower electric voltage is generated in the piezoelectric layer and the electric output signal generated by the device is smaller compared with the device shown in FIG. 3.

The comparison of the devices in FIGS. 3 and 4 shows that by means of a suitable choice of the thickness of the support 4, it can be ensured that the piezoelectric layer 5 of the piezoelectric transducer element 3 experiences a high mechanical stress. In this way, a strong electric output signal of the device 1 is ensured in sensor operation. In actuator operation a strong mechanical deformation of the device 1 is made possible by a sufficiently thick support 4.

The thickness of the support 4 should be at least so large that the neutral fiber 10 lies inside the support 4. The thicker the support 4 is configured to be, the deeper the neutral fiber 10 can be shifted into the support 4 and the stronger the signal generated by the piezoelectric transducer element 3 can be.

Figure 5:
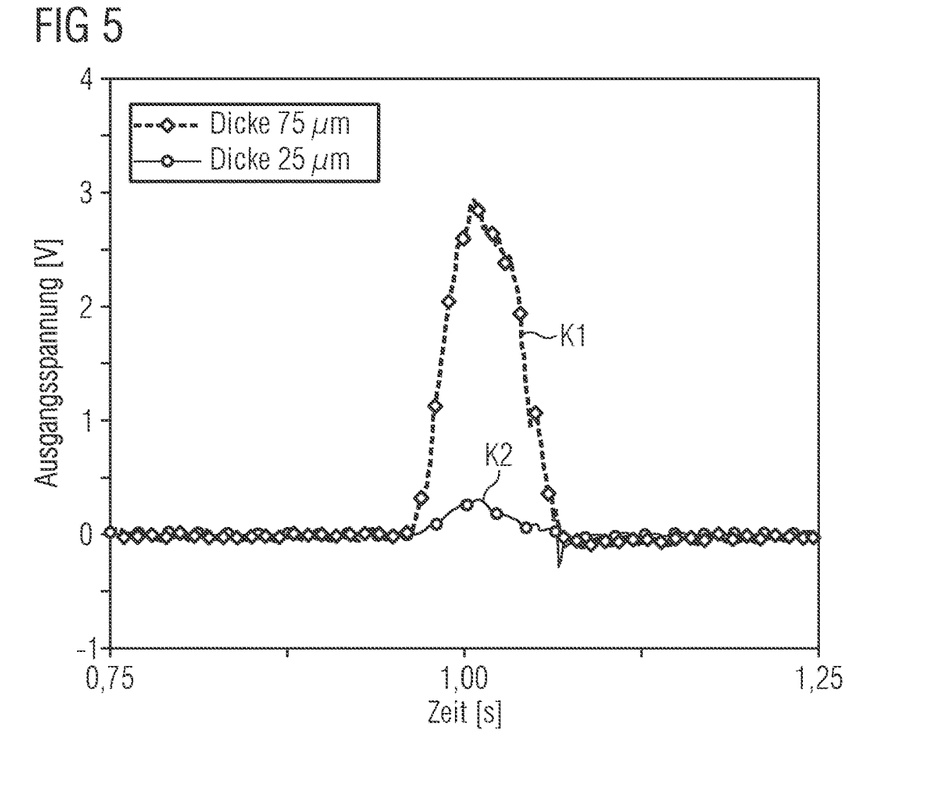
FIG. 5 shows the results of a measurement.

The influence of the support geometry on the signal provided by the piezoelectric transducer element 3 was investigated in a comparative measurement by means of two devices 1 having structurally the same piezoelectric transducer elements 3. FIG. 5 shows the results of the comparative measurement.

Both devices 1 each have a length of 20 mm and a width of 10 mm. The length gives the extension from the first end 8 to the second end 9. The width gives the extension in a direction perpendicular thereto. The thickness of the device 1 gives an extension of the device 1 in a stacking direction in which the support 4 and the piezoelectric transducer element 3 are stacked one above the other. The thickness is perpendicular to the width and to the length.

Both devices 1 comprise a piezoelectric transducer element 3 with a piezoelectric layer 5, which consists of a ferroelectric polymer, PVDF:TrFE, in a thickness of 10 μm. The lower electrode 7 consists of PEDOT:PSS and the upper electrode 6 consists of carbon. A support 4 consisting of polyimide was used for both devices 1. The two devices 1 merely differ in the thickness of the support 4. The first device 1 has a support 4 having a thickness of 75 μm. The second device 1 has a support 4 having a thickness of 25 μm. Both devices 1 were deformed in a test rig at the same deformation rate over the same deformation path. The deformation rate was 0.4 m/s and the deformation path 4 mm.

In FIG. 5 the electric output signal of the first device 1 is plotted in curve K1 and the electric output signal of the second device 1 is plotted in curve K2. In this case, the time in seconds is plotted on the horizontal axis. The electric output signal in volts is plotted on the vertical axis. It can be seen that the electric output signal of the first device 1 is significantly larger with the same deformation and the same properties of the piezoelectric transducer element 3. In particular, the electric output signal of the first device 1 is approximately 9 times the electric output signal of the second device 1. The significantly higher electric output signal of the first device results from the fact that in the first device the neutral fiber 10 has a more favorable position compared to the second device. In the first device as a result of the greater thickness of the support 4, the neutral fiber 10 is disposed further away from the piezoelectric transducer element 3 and the piezoelectric transducer element 3 undergoes a stronger deformation.

Figure 6:
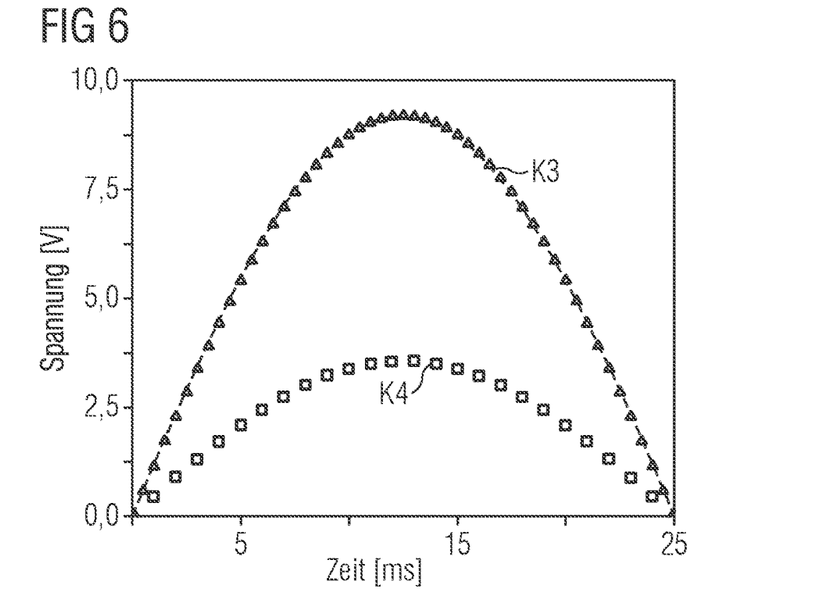
FIG. 6 shows the results of a simulation which was carried out by means of the finite element method.

FIG. 6 shows the results of a simulation which was carried out by means of the finite element method. In the simulation two devices 1 are considered, which each have a piezoelectric transducer element 4 having a piezoelectric layer 5 comprising PVDF:TrFE. The support 4 consists of polyimide in both devices 1. The support 4 of a second device 1 has a fivefold mechanical strength compared to the support 4 of a first device 1.

The time is plotted in ms on the horizontal axis. The output voltage is plotted in V on the vertical axis. The curve K3 shows the magnitude of the electric voltage generated by the piezoelectric transducer element 3 of the second device 1 over the time of a deformation. The curve K4 shows the electric voltage generated by the piezoelectric transducer element 3 of the first device 1 over the time of the deformation. Both devices are deformed over the same distance. The second device generates a higher voltage in its output signal. Since the mechanical strength of the support 4 is greater in the second device, the neutral fiber 10 is shifted deeper into the support 4 and therefore further away from the piezoelectric transducer element 3. Accordingly, the piezoelectric transducer element 3 undergoes a greater mechanical deformation and therefore generates a higher voltage.

Figure 7:
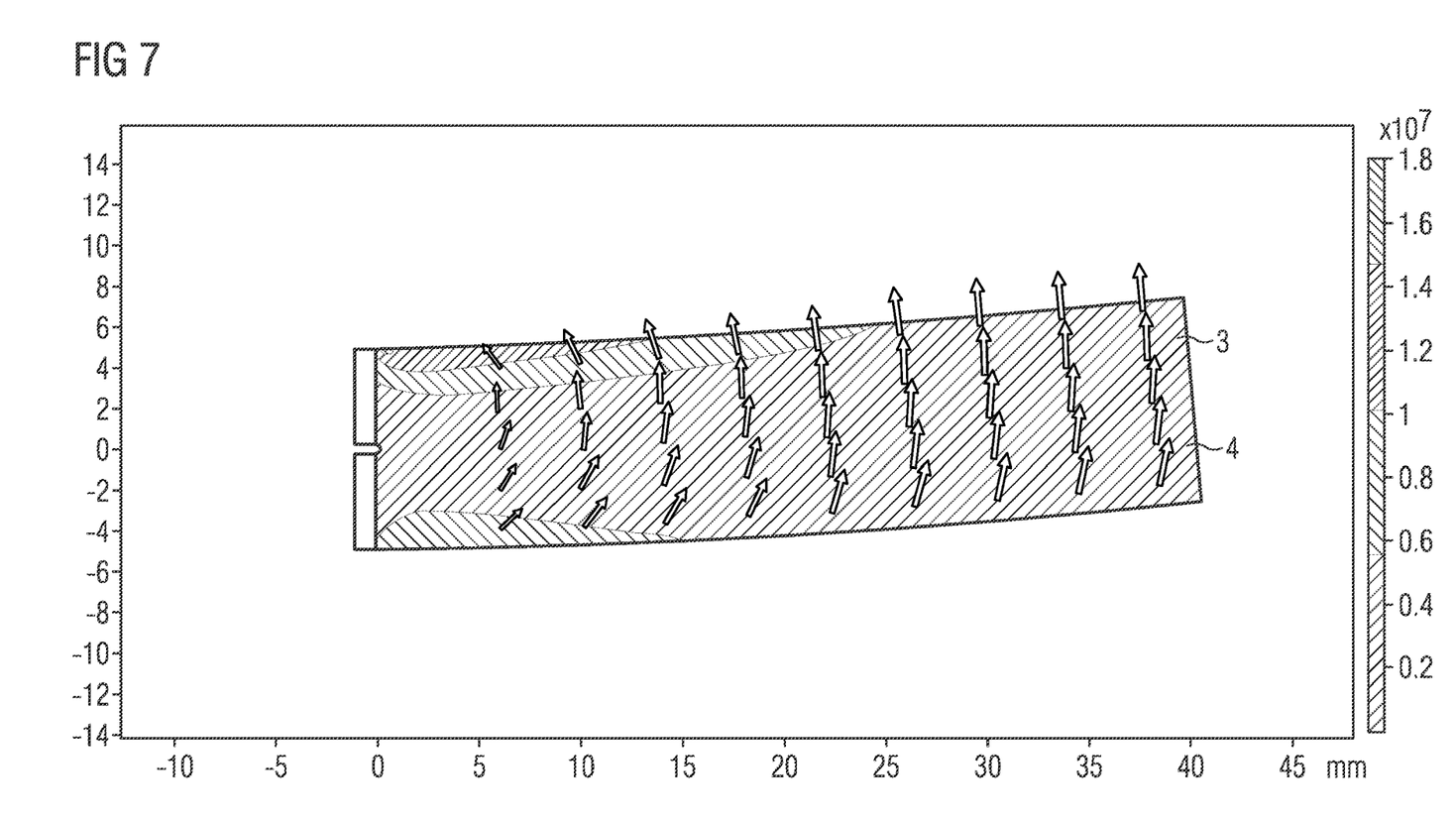
FIG. 7 and FIG. 8 show the results of further simulations.
Figure 8:
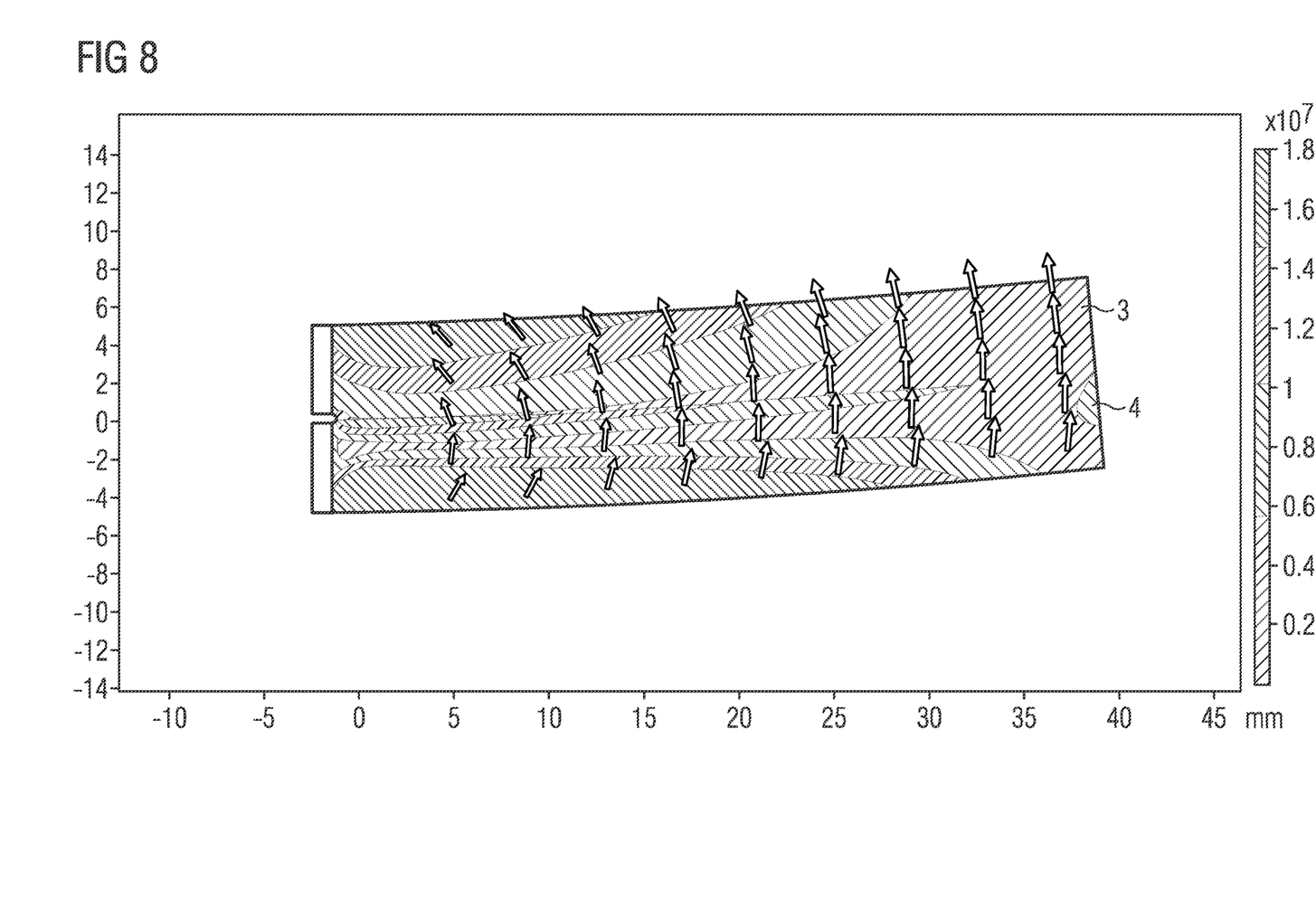

FIG. 7 and FIG. 8 show the results of a further simulation. In each case, the mechanical stress produced locally inside the device in a device 1 configured as a beam clamped on one side is observed in FIGS. 7 and 8. Two structurally identical beams which are deflected by the same distance are considered here. However, the beam shown in FIG. 7 differs from the beam shown in FIG. 8 in the modulus of elasticity of the support 4. In the beam considered in FIG. 7, the support 4 has a lower strength. A comparison of FIGS. 7 and 8 shows that with the same design and the same deflection in the piezoelectric transducer element 3 that is applied to a support 4 having a high strength, higher mechanical stresses and therefore higher electric voltages are generated. By means of a suitable choice of the mechanical strength or the modulus of elasticity of the support 4, it can be ensured that the piezoelectric transducer element 3 delivers a good output signal or brings about a strong mechanical deformation during actuator operation.

Figure 9:
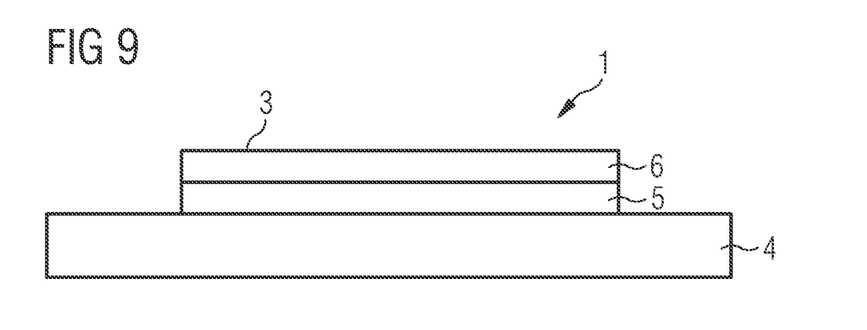
FIG. 9 shows a device according to a second exemplary embodiment.

FIG. 9 shows schematically a second exemplary embodiment of the device 1. The device 1 shown in FIG. 9 differs from the device shown in FIG. 2 in the material of the support 4. The device shown in FIG. 9 has a support made of a conductive material, for example, a metal support.

A separate lower electrode 7 of the piezoelectric transducer element 3 is not necessary in this case. Rather, a material of the support 4 can take over the electric contacting of the piezoelectric layer 5 of the piezoelectric transducer element 3. The piezoelectric layer 5 can then be applied directly to the support 4. The support 4 has contact surfaces 11 via which an electric voltage can be applied. The contact surfaces 11 consist of an electrically conductive connecting material, for example, silver or silver epoxide resin.

Figure 10:
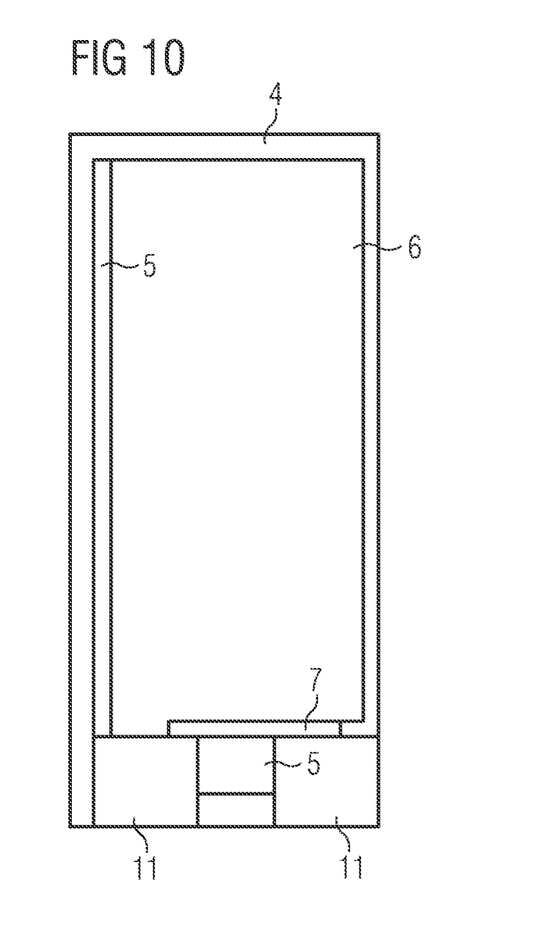
FIG. 10 shows a plan view of the device shown in FIG. 9.

FIG. 10 shows a plan view of the top side of the device 1 according to the first exemplary embodiment.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. A device comprising:
    a piezoelectric transducer element and a support connected mechanically to each other thereby forming an assembly, wherein the piezoelectric transducer element and the support are configured to be jointly deformed under an action of a first force,
    wherein the support comprises a neutral fiber arranged inside the support, the neutral fiber configured not to undergo any change in length during a bending of the assembly, and
    wherein the piezoelectric transducer element comprises a ceramic layer or a ferroelectric polymer layer or a layer comprising a composite material including a ceramic material and a piezoelectric polymer matrix.

2. The device according to claim 1, wherein a thickness of the support is configured such that the neutral fiber is arranged inside the support.

3. The device according to claim 1, wherein a thickness of the support lies in a range between 1 μm and 500 μm, inclusive.

4. The device according to claim 1, wherein a modulus of elasticity of the support is configured such that the neutral fiber is arranged inside the support.

5. The device according to claim 1, further comprising a sensor configured to detect a deformation produced by the first force acting on the device.

6. The device according to claim 5, wherein the device is configured to produce an electric voltage and/or a charge in the piezoelectric transducer element when the first force is acting on the device, and wherein the device is connected to an evaluation electronics system configured to measure a magnitude of the electric voltage and/or the charge.

7. The device according to claim 1, further comprising an actuator.

8. The device according to claim 7, wherein the device is configured to produce a second mechanical force when the first force is an applied electric voltage.

9. The device according to claim 1, wherein the piezoelectric transducer element has a multilayer structure with a plurality of piezoelectric layers and interposed inner electrodes.

10. The device according to claim 1, wherein the piezoelectric transducer element comprises a single piezoelectric layer, an upper electrode, and a lower electrode, and wherein the piezoelectric layer is disposed between the upper electrode and the lower electrode.

11. The device according to claim 1, wherein the piezoelectric transducer element comprises a single piezoelectric layer and an upper electrode, wherein the piezoelectric layer is disposed between the upper electrode and the support, and wherein the support comprises an electrode comprising a conductive material.

12. The device according to claim 1, wherein the support comprises a plastic or a metal.

13. An arrangement comprising:
an evaluation electronics system; and
the device according to claim 1,
wherein the evaluation electronics system is configured to measure an electric signal generated by the device.

14. The arrangement according to claim 13, wherein the evaluation electronics system is configured to detect, by measuring a change in the electric signal, whether an object is approaching the device or whether an object is touching the device.

15. A device comprising:
a piezoelectric transducer element and a support connected mechanically to each other to form an assembly,
wherein the piezoelectric transducer element and the support are configured to be jointly deformed under an action of a force,
wherein the support comprises a neutral fiber arranged inside the support, the neutral fiber configured not to undergo any change in length during a bending of the assembly,
and
wherein the support comprises an electrode comprising a conductive material.

16. A method comprising:
jointly deforming, by an action of a first force, an assembly so that a length of a neutral fiber arranged inside a support is not changed when the assembly is bent,
wherein the assembly comprises a piezoelectric transducer element and the support connected mechanically to each other, and
wherein the piezoelectric transducer element comprises a ceramic layer or a ferroelectric polymer layer or a layer comprising a composite material including a ceramic material and a piezoelectric polymer matrix.

* * * * *